United States Patent
Tomita

(10) Patent No.: US 7,120,416 B2
(45) Date of Patent: Oct. 10, 2006

(54) SEMICONDUCTOR DEVICE AND RECEIVER

(75) Inventor: Kazuhiro Tomita, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 398 days.

(21) Appl. No.: 10/625,569

(22) Filed: Jul. 24, 2003

(65) Prior Publication Data
US 2004/0119099 A1   Jun. 24, 2004

(30) Foreign Application Priority Data
Jul. 24, 2002   (JP) ............................. 2002-215405

(51) Int. Cl.
*H04B 1/10* (2006.01)
(52) U.S. Cl. ........................ 455/340; 455/339; 455/266
(58) Field of Classification Search ................ 455/310, 455/296, 318, 255, 258, 259, 203, 266, 339, 455/340, 196.1, 260, 265, 337
See application file for complete search history.

(56) References Cited

U.S. PATENT DOCUMENTS

| 5,487,186 A * | 1/1996 | Scarpa ..................... 455/192.2 |
| 6,735,425 B1 * | 5/2004 | Parisel et al. ................ 455/255 |
| 2002/0173284 A1 * | 11/2002 | Forrester ..................... 455/255 |
| 2003/0050029 A1 * | 3/2003 | Kaufmann et al. ......... 455/260 |
| 2003/0119466 A1 * | 6/2003 | Goldman ..................... 455/260 |
| 2003/0203724 A1 * | 10/2003 | Luo et al. .................... 455/147 |

* cited by examiner

*Primary Examiner*—Quochien B. Vuong
*Assistant Examiner*—Christian A. Hannon
(74) *Attorney, Agent, or Firm*—Arent Fox PLLC

(57) ABSTRACT

A semiconductor device for demodulating a received signal in a satisfactory manner when the frequency of the received signal deviates. The semiconductor device is used in a receiver having a reference oscillator. The semiconductor device includes a local oscillator, a PLL controller, and a comparator. The local oscillator generates a local signal having a local frequency. The PLL controller controls the local frequency in accordance with a reference signal of the reference oscillator. The comparator compares the frequency of the received signal with the frequency of the reference signal or the phase of the received signal with the phase of the reference signal to generate an error signal for correcting the local frequency in accordance with the comparison.

18 Claims, 3 Drawing Sheets

SEMICONDUCTOR DEVICE AND RECEIVER

CROSS-REFERENCE TO RELATED APPLICATION

This application is based upon and claims the benefit of priority from Japanese Patent Application No. 2002-215405, filed on Jul. 24, 2002, the entire contents of which are incorporated herein by reference.

BACKGROUND OF THE INVENTION

The present invention relates to a semiconductor device and a receiver.

In wireless communication (wireless link), the frequency accuracy of a wireless device (transmitting and receiving device) is standardized to maintain the accuracy required for guaranteeing satisfactory communication quality. A reference oscillator, which is incorporated in a wireless device, is required to have a high frequency accuracy to enable temperature compensation. However, the wireless standard is relatively moderate (the margin of error allowed for frequencies being relatively broad) for wireless devices used in a short-distance wireless link. As an example, in BLUE-TOOTH, for each channel having a bandwidth of 1 MHz, an initial frequency accuracy of 75 KHz and a frequency drift of 40 KHz are tolerated. In such a case, the wireless device does not require a highly accurate reference oscillator and thus reduces costs. When a relatively moderate standard is used, a receiver must perform demodulation correctly even when there is an error in the frequency of the signal received from a transmitter.

During wireless communication, if the frequency of the signal received from the receiver is not included in the range of a channel selecting band pass filter (BPF), the received signal is distorted. This increases interference between codes and increases the bit error rate. As a result, the receiver cannot correctly demodulate the receiving signal.

Accordingly, in a conventional receiver, the number of stages in the BPF is increased to prevent a decrease in the receiving capability with respect to frequencies that are not included in a channel. By increasing the number of stages in the BPF, the passing bandwidth is broadened to include predetermined tolerated frequencies. When merely broadening the passage bandwidth of a single BPF, the attenuation outside the channel is reduced. Thus, the increase in the number of stages of the BPF prevents a decrease in the attenuating capability.

Normally, in an FM receiver, the intensity of the receiving signal of the receiver is monitored to vary the oscillation frequency of a local oscillator (LO) in accordance with the signal intensity. This adjusts the intermediate frequency (IF) of the received signal to the center of the BPF passage bandwidth. For example, in a mobile communication terminal, such as a cellular phone, the receiving sensitivity is improved to control the reference frequency of the mobile terminal so that it matches the reference frequency of a base station.

However, when broadening the passage bandwidth of the BPF, the noise resisting capability of the receiver decreases. Thus, the receiving capability cannot be improved. Further, an increase in the number of stages of the BPF increases the circuit area. Since the circuit area of the BPF is especially large, the receiver is enlarged when the number of stages is increased.

The BPF is normally incorporated in the receiver. The frequency of the IF signal used in the receiver is usually set at a low frequency (for example, 1 to 3 MHz for BLUE-TOOTH) in correspondence with the channel of the BPF. That is, the received signal is converted to the low frequency IF signal to reduce the circuit area of the receiver and lower costs. In such a receiver, the conventional adjustment of the local oscillator frequency in accordance with the intensity of the received signal decreases the detection accuracy near the peak of the signal intensity. Thus, the frequency of the IF signal cannot be controlled accurately. Further, such a receiver cannot cope with fading that occurs in the level of the received signal and cannot be applied to controls that require high speed response, such as time division duplex (TDD).

In a short-distance wireless link in which devices provided with the BLUETOOTH function are connected, every one of the devices may be a master device or a slave device. In such a case, when controlling the reference frequency of the slave device to match the reference frequency of the master device, the receiving capability of the slave device is improved. However, the initial frequency accuracy decreases when the slave device transmits a signal. Such control is not preferable.

SUMMARY OF THE INVENTION

One aspect of the present invention is a semiconductor device for a receiver having a reference oscillator. The receiver uses a reference signal generated by the reference oscillator to receive a signal in a predetermined channel bandwidth. The semiconductor device includes a local oscillator for generating a local signal having a local frequency. A PLL controller is connected to the local oscillator for controlling the local frequency in accordance with the reference signal to set the channel bandwidth. A comparator is connected to the local oscillator to compare frequency of the received signal with frequency of the reference signal or phase of the received signal with phase of the reference signal and generate an error signal in accordance with the comparison to correct the local frequency.

Another aspect of the present invention is a semiconductor device for a receiver having a reference oscillator. The receiver uses a reference signal generated by the reference oscillator to receive a signal in a predetermined channel bandwidth. The semiconductor device includes a local oscillator for generating a local signal. A first control loop includes the local oscillator for controlling a frequency of the local signal based on the reference signal to set the channel bandwidth. A second control loop includes the local oscillator for comparing frequency of the received signal with frequency of the reference signal or phase of the received signal with phase of the reference signal and generating an error signal in accordance with the comparison to correct the local frequency.

A further aspect of the present invention is a semiconductor device for a receiver having a reference oscillator. The receiver uses a reference signal generated by the reference oscillator to receive a signal of a predetermined channel. The semiconductor device includes a local oscillator for generating a local signal. A mixer is connected to the local oscillator for generating an intermediate frequency signal having a predetermined intermediate frequency with the local signal and the received signal. A PLL controller is connected to the local oscillator for setting a frequency of the local signal with the reference signal to receive the received signal of the predetermined channel. A comparator is connected to the local oscillator for comparing a frequency of the intermediate frequency signal with frequency of the reference signal or phase of the intermediate frequency signal with phase of the reference signal and generating an error signal in accordance with the comparison to correct the frequency of the local signal.

A further aspect of the present invention is a receiver for receiving a signal. The receiver includes a reference oscillator for generating a reference frequency signal having a reference frequency. A local oscillator generates a local signal. A band pass filter has a predetermined passage bandwidth. A channel setting circuit is connected to the reference oscillator and the local oscillator for controlling frequency of the local signal in accordance with the reference frequency signal and setting the passage bandwidth of the band pass filter to a predetermined channel bandwidth. A frequency correction circuit compares frequency of the received signal received in the channel bandwidth with frequency of the reference signal or phase of the received signal with phase of the reference signal and generating an error signal in accordance with the comparison to correct the frequency of the local signal.

A further aspect of the present invention is a method for correcting frequency of a local signal in a receiver. The receiver includes a reference oscillator for generating a reference signal having a reference frequency, and a band pass filter. The method includes setting a center frequency of the band pass filter with the reference signal, generating a local signal for receiving a signal of a predetermined channel with the reference signal, generating an intermediate frequency signal having a predetermined intermediate frequency with the received signal and the local signal, providing the intermediate frequency signal to the band pass filter, generating an error signal in accordance with a comparison between frequency of the intermediate frequency signal that passed through the band pass filter and frequency of the reference signal or a comparison between phase of the intermediate frequency signal with phase of the reference signal, and correcting the frequency of the local signal in accordance with the error signal.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
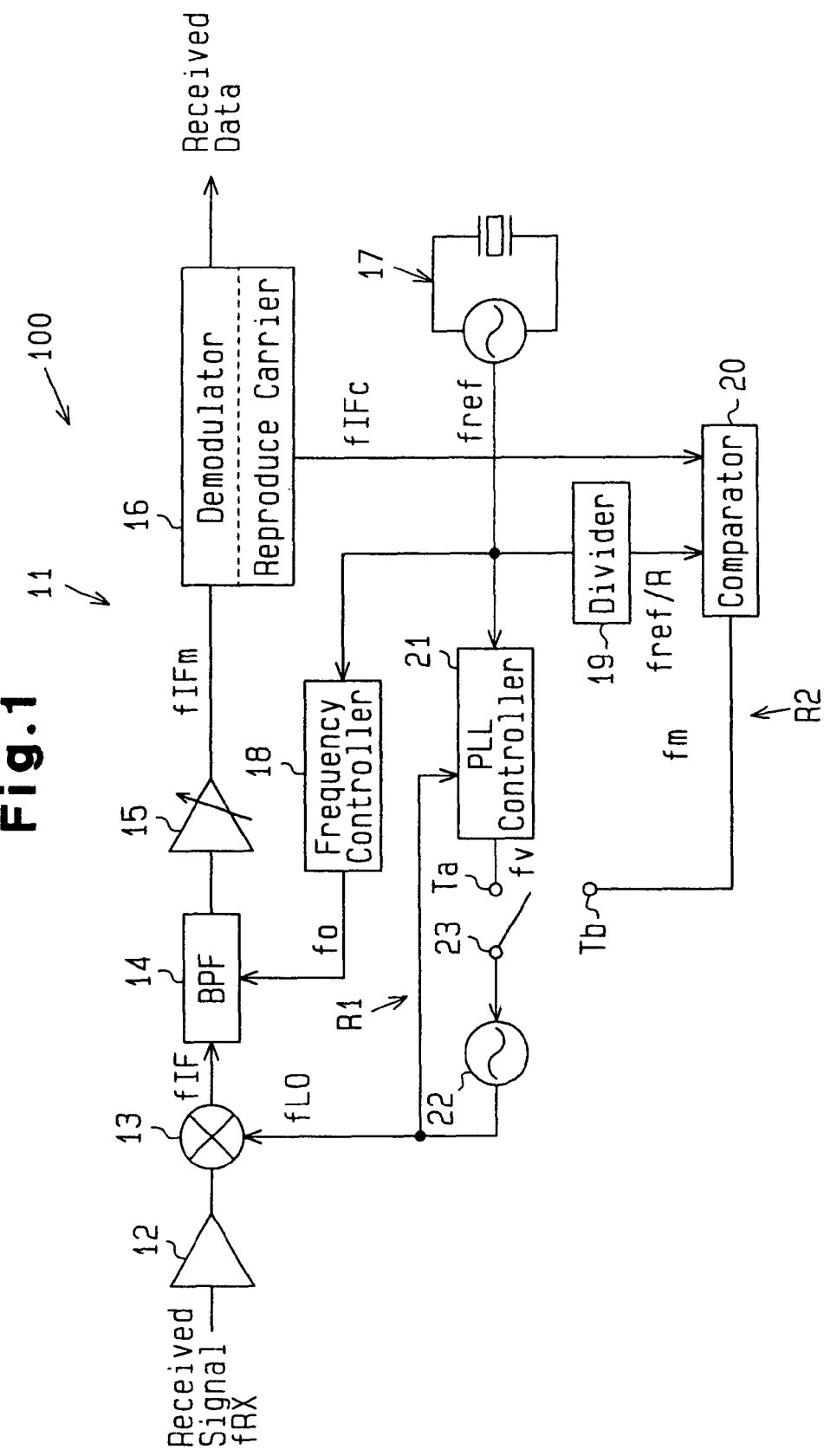
FIG. 1 is a schematic block circuit diagram of a receiver according to a first embodiment of the present invention.

In the drawings, like numerals are used for like elements throughout.

FIG. 1 is a schematic block diagram of a receiver 11 according to a first embodiment of the present invention. FIG. 1 also shows part of a transmitter for a wireless device 100. The receiver 11 includes an amplifier 12, a mixer 13, a band pass filter (BPF) 14, an automatic gain controller (AGC) 15, a demodulator 16, a reference oscillator 17, a frequency controller 18, a divider 19, a comparator 20 functioning as a frequency correction circuit, a PLL controller 21 functioning as a channel setting circuit, and a local oscillator 22. The receiver 11 is configured as a semiconductor device on a single chip except for the crystal oscillator of the reference oscillator 17.

The amplifier 12 amplifies a signal fRX received from a transmitter (not shown) and provides the amplified received signal fRX to the mixer 13. The mixer 13 mixes the amplified received signal fRX with a local signal fLO of the local oscillator 22 to generate an intermediate frequency signal fIF (fRX−FLO) having an intermediate frequency corresponding to the frequency difference between the received signal fRX and the local signal fLO. The intermediate frequency signal fIF is provided to the BPF 14.

The passage bandwidth of the BPF 14 has a center frequency fo that is set by the frequency controller 18. More specifically, the frequency controller 18 controls the center frequency fo so that it matches a frequency (hereinafter referred to as intermediate frequency) IF of an intermediate frequency signal fIF based on the frequency of a reference signal fref, which is provided from the reference oscillator 17. The BPF 14 provides the AGC 15 with the intermediate frequency signal fIF from which frequency components outside the passage bandwidth are eliminated. The AGC 15 amplifies the intermediate frequency signal fIF filtered by the BPF 14 to a level enabling demodulation with the demodulator 16 and generates an amplified intermediate frequency signal fIFm.

The demodulator 16 demodulates the amplified intermediate frequency signal fIFm, extracts the received data (digital data) from the signal fIFm, and provides the received signal to an internal circuit (not shown). The demodulator 16 generates a carrier signal fIFc from the amplified intermediate frequency signal fIFm and provides the comparator 20 with the carrier signal fIFc.

The comparator 20 receives the carrier signal fIFc and a divisional signal fref/R. The divider 19 divides the frequency of the reference signal fref by a dividing ratio 1/R to generate the divisional signal fref/R. The comparator 20 compares the carrier signal fIFc and the divisional signal fref/R to generate an error signal fm corresponding to the frequency difference. The error signal fm is provided to the local oscillator 22.

The PLL controller 21 receives the reference signal fref from the reference oscillator 17 and the local signal fLO from the local oscillator 22 to generate a control signal fv based on the frequency difference (phase difference) between the signals fref and fLO. The control signal fv is provided to the local oscillator 22.

The comparator 20 and the PLL controller 21 each have an output terminal connected to a loop switching switch 23, which is a loop switching circuit. The loop switching switch 23 switches its connection with a first terminal Ta and a second terminal Tb to switch the input of the local oscillator 22 between the control signal fv from the PLL controller 21 and the error signal fm from the comparator 20.

More specifically, when the loop switching switch 23 is switched to the first terminal Ta, the PLL controller 21 and the local oscillator 22 configure a first control loop R1. The first control loop R1 sets a channel bandwidth (frequency bandwidth) to receive the received signal fRX. That is, the first control loop R1 sets the received channel bandwidth to set the oscillation frequency of the local oscillator 22 at the desired frequency based on the reference signal fref and the local signal fLO, which is fed back.

When the loop switching switch 23 is switched to the second terminal Tb, the mixer 13, the BPF 14, the AGC 15, the demodulator 16, the comparator 20, and the local oscillator 22 configure a second control loop R2. The second control loop R2 controls the intermediate frequency IF at a constant value. In the second control loop R2, the oscillation frequency of the local oscillator 22 is corrected in accordance with the error signal fm from the comparator 20 so that the intermediate frequency IF matches the center frequency fo of the BPF 14.

In the first embodiment, the local oscillator 22 is, for example, a voltage control oscillator (VCO), and used as a modulator when the transmitter (not shown) transmits data.

The operation of the receiver 11 will now be discussed. The frequency controller 18 sets the center frequency fo of the BPF 14 based on the frequency of the reference signal fref. The loop switching switch 23 switches to the first terminal Ta (i.e., the first control loop R1) so that the PLL controller 21 controls the oscillation frequency of the local oscillator 22 and sets the channel bandwidth for receiving signals. After setting the channel bandwidth, the loop switching switch 23 switches to the second terminal Tb (i.e., the second control loop R2).

When the receiver 11 receives the received signal fRX, the amplifier 12 amplifies the received signal fRX and provides the mixer 13 with the amplified received signal fRX. The mixer 13 generates the intermediate frequency signal fIF with the received signal fRX and the local signal fLO. The frequency controller 18 presets the center frequency fo of the BPF 14 so that it is about the same as the intermediate frequency IF. Thus, the BPF 14 eliminates unnecessary frequency components included in the intermediate frequency signal fIF in a preferable manner. The AGC 15 amplifies the intermediate frequency signal fIF to generate the intermediate frequency signal fIFm and provides the demodulator 16 with the amplified intermediate frequency signal fIFm. The demodulator 16 demodulates the amplified intermediate frequency signal fIFm to generate the received data and the carrier signal fIFc. The comparator 20 is provided with the carrier signal fIFc.

The comparator 20 compares the carrier signal fIFc with the divisional signal fref/R to generate the error signal fm in accordance with the frequency difference between the signals fIFc and fref/R. In this state, the loop switching switch 23 switches to the second terminal Tb to provide the error signal fm from the comparator 20 to the local oscillator 22. Thus, the oscillation frequency of the local oscillator 22 is corrected in accordance with the error signal fm so that the intermediate frequency IF matches the center frequency fo of the BPF 14.

The receiver 11 of the first embodiment has the advantages described below.

(1) In the receiver 11, after the PLL controller 21 of the first control loop R1 sets the channel bandwidth of the received signal fRX, the comparator 20 of the second control loop R2 corrects the frequency of the local oscillator 22 in accordance with the comparison result of the carrier signal fIFc and the divisional signal fref/R. The center frequency fo of the BPF 14 is preset in accordance with the reference signal fref so that it generally matches the intermediate frequency IF. That is, in the receiver 11, the center frequency fo of the BPF 14 and the intermediate frequency IF are both controlled in accordance with the frequency of the reference signal fref. Thus, the intermediate frequency IF is accurately matched with the center frequency fo even if the received frequency is deviated or even if a frequency drift occurs. Accordingly, the receiving capability is prevented from decreasing, that is, the bit error rate is prevented from increasing. Further, the received signal fRX is accurately demodulated.

(2) The center frequency fo of the BPF 14 is controlled in accordance with the reference signal fref to generally match the intermediate frequency IF. Thus, the BPF 14 eliminates unnecessary signals included in the intermediate frequency signal fIF. Accordingly, the receiving capability is prevented from being decreased when receiving an interference signal or the like.

(3) The number of stages in the BPF does not have to be increased. Thus, the circuit area is not increased and the receiver 11 does not have to be enlarged.

(4) The local oscillator 22 of the receiver 11 also functions as the modulator of the transmitter. This decreases the manufacturing cost of the receiver 11.

(5) The PLL controller 21 controls the frequency of the local oscillator during channel setting. This enables frequency switching control, for example, frequency hopping, to be performed at a high speed.

Figure 2:
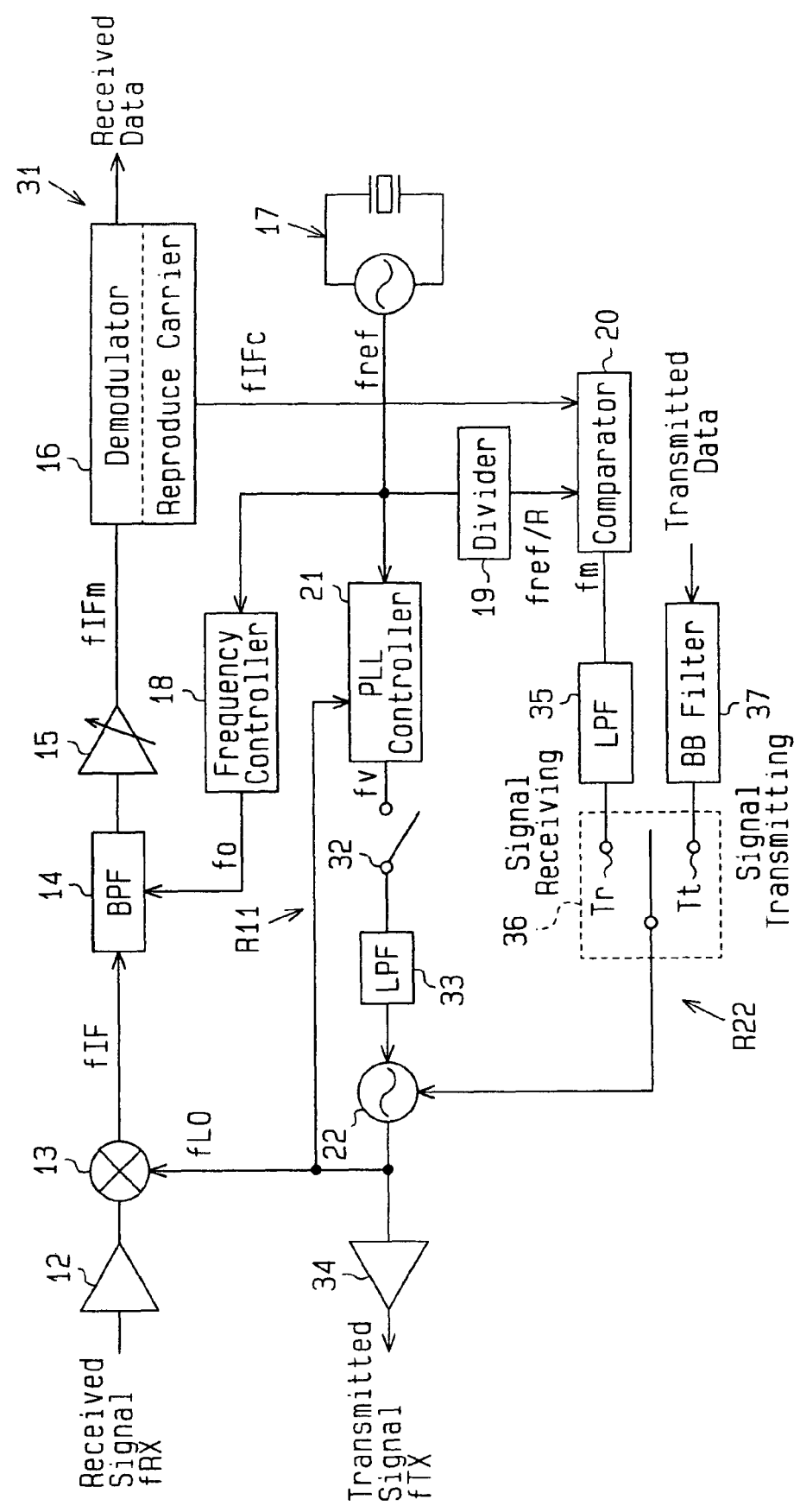
FIG. 2 is a schematic block circuit diagram of a receiver according to a second embodiment of the present invention.

FIG. 2 is a schematic block circuit diagram of a receiver 31 according to a second embodiment of the present invention. FIG. 2 also shows part of a transmitter for a wireless device 200. The receiver 31 of the second embodiment is configured as a semiconductor device on a single chip except for the crystal oscillator of the reference oscillator 17.

In the receiver 31, the PLL controller 21 is connected to the local oscillator 22 via a switching device (switch) 32 and a first low pass filter (LPF) 33, and the local oscillator 22 is connected to an amplifier 34. The first LPF 33 smoothens the control signal fv from the PLL controller 21 and eliminates high frequency components from the control signal fv. Then, the first LPF 33 provides the local oscillator 22 with the control signal fv from which high frequency components have been eliminated. The switch 32 controls the opening and closing of the first control loop R1. The first control loop R1 is closed when the switch 32 is ON and opened when the switch 32 is OFF.

The comparator 20 is connected to a second LPF 35, which is further connected to the local oscillator 22 via a transmitting-receiving switching switch 36. The transmitting-receiving switching switch 36 has a receiving terminal Tr and a transmitting terminal Tt. The second LPF 35 is connected to the receiving terminal Tr. The transmitting terminal Tt is connected to a base band (BB) filter 37, which is a bandwidth restriction filter.

When receiving a signal, the receiver 31 first sets the channel bandwidth with the first control loop R11. The center frequency fo of the BPF 14 is preset in accordance with the reference signal fref. Then, the transmitting-receiving switching switch 36 connects the receiving terminal Tr to configure the second control loop R22. In this state, the receiver 31 corrects the frequency of the local oscillator 22 so that the intermediate frequency IF generally matches the center frequency fo of the BPF 14.

To transmit a signal, the transmitting-receiving switching switch 36 connects the transmitting terminal Tt. As a result, transmission data is provided to the local oscillator 22 via the BB filter 37 and modulated. The amplifier 34 then amplifies the modulated data to generate a transmitted signal fTX.

When receiving a signal, the receiver 31 of the second embodiment performs frequency control with the local oscillator 22, which also functions as the modulator of the transmitter. This decreases the number of components in the receiver 31 and efficiently configures circuits.

Figure 3:
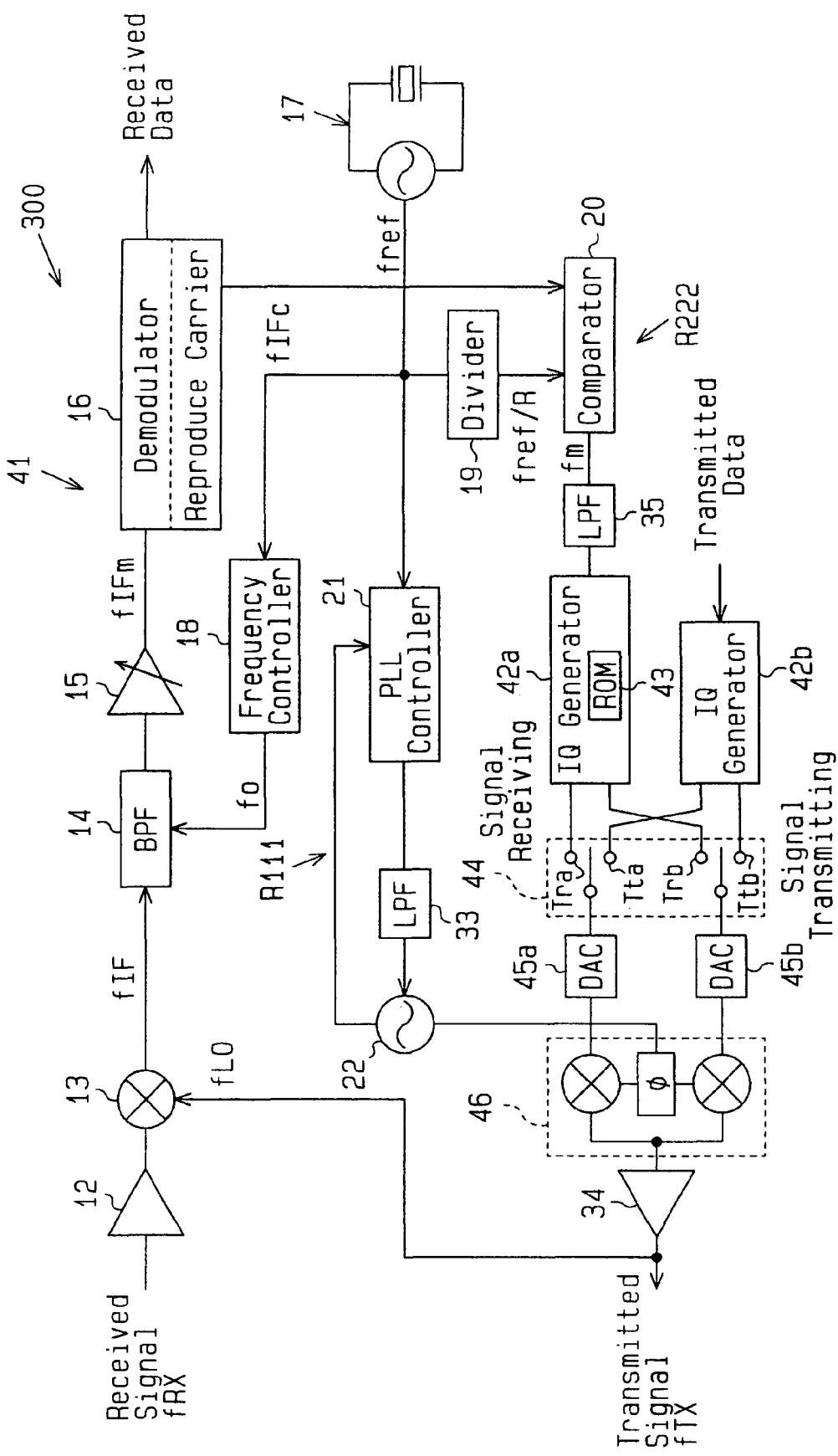
FIG. 3 is a schematic block circuit diagram of a receiver according to a third embodiment of the present invention.

FIG. 3 is a schematic block circuit diagram of a receiver 41 according to a third embodiment of the present invention. The receiver 41 is configured by partially changing the configuration of the receiver 31 in the second embodiment. FIG. 3 also shows part of a transmitter for a wireless device 300. The receiver 41 is configured as a semiconductor device on a single chip except for the crystal oscillator of the reference oscillator 17.

In the receiver 41, the comparator 20 is connected to a first IQ generator 42a, which functions as a signal generator, via the second LPF 35. The first IQ generator 42a generates a frequency signal in accordance with the error signal fm from the comparator 20. The first IQ generator 42a incorporates a ROM 43, which prestores data (corrected data) corresponding to the frequency signal generated by the first IQ generator 42a in accordance with the error signal fm.

The first IQ generator 42a is connected to a quadrature modulator 46 via a transmitting-receiving switching switch 44 and first and second D/A converters (DAC) 45a and 45b. The quadrature modulator 46 is connected to the amplifier 34. The output terminal of the amplifier 34 is connected to the mixer 13.

The transmitting-receiving switching switch 44 includes receiving terminals Tra and Trb and transmitting terminals Tta and Ttb. The first IQ generator 42a is connected to the receiving terminals Tra and Trb. A second IQ generator 42b is connected to the transmitting terminals Tta and Ttb of the transmitting-receiving switching switch 44.

When receiving a signal, the receiver 41 first sets the channel bandwidth with a first control loop R111. In this state, the center frequency fo of the BPF 14 is preset in accordance with the reference signal fref. Then, the transmitting-receiving switching switch 44 connects the receiving terminals Tra and Trb to configure a second control loop R222. The receiver 41 modulates the output signal of the local oscillator 22 in accordance with the error signal fm from the comparator 20 and corrects the frequency of the local oscillator 22 so that the intermediate frequency IF generally matches the center frequency fo of the BPF 14.

The first IQ generator 42a randomly reads corrected data corresponding to a correction frequency signal, which is generated in accordance with the error signal fm. The DAC 45a and the DAC 45b convert the read corrected data to an analog signal and provide the analog signal to the quadrature modulator 46. Accordingly, the frequencies are output in a dispersed manner from the DAC 45a and the DAC 45b. Thus, to stably receive signals, a latch circuit may be provided to latch the corrected data output from the first IQ generator 42a.

To transmit a signal, the transmitting-receiving switching switch 44 is connected to the transmitting terminals Tta and Ttb. The transmitted data is provided to the DAC 45a and the DAC 45b via the second IQ generator 42. The DAC 45a and 45b convert the transmitted data to an analog signal. The quadrature modulator 46 then modulates the analog signal. Then, the amplifier 34 amplifies the modulated analog signal to generate a transmitted signal fTX, which is transmitted.

The receiver 41 performs frequency control when receiving a signal with the quadrature modulator 46, which is used in the transmitter. This decreases the number of components in the receiver 41 and efficiently configures circuits.

It should be apparent to those skilled in the art that the present invention may be embodied in many other specific forms without departing from the spirit or scope of the invention. Particularly, it should be understood that the present invention may be embodied in the following forms.

In each of the above embodiments, the comparator 20 may compare the carrier signal fIFc, which has been divided or multiplied, with the reference signal fref.

In each of the above embodiments, the comparator 20 compares the phases of the carrier signal fIFc and the reference signal fref to generate an error signal fm in accordance with the phase difference.

The present examples and embodiments are to be considered as illustrative and not restrictive, and the invention is not to be limited to the details given herein, but may be modified within the scope and equivalence of the appended claims.

What is claimed is:

1. A semiconductor device for a receiver having a reference oscillator and a band pass filter, wherein the receiver uses a reference signal generated by the reference oscillator to receive a signal in a predetermined channel bandwidth, the semiconductor device comprising:
   a local oscillator for generating a local signal having a local frequency;
   a PLL controller connected to the local oscillator for controlling the local frequency in accordance with the reference signal to set the channel bandwidth;
   a comparator connected to the local oscillator for comparing frequency of the received signal with frequency of the reference signal or phase of the received signal with phase of the reference signal and generating an error signal in accordance with the comparison to correct the local frequency; and
   a frequency controller connected to the band pass filter to set a center frequency of the band pass filter using the reference signal.

2. The semiconductor device according to claim 1, further comprising:
   a demodulator for demodulating the received signal to generate a carrier signal, wherein the comparator compares frequency of the carrier signal with frequency of the reference signal or phase of the carrier signal with phase of the reference signal to generate the error signal in accordance with the comparison.

3. The semiconductor device according to claim 1, wherein the receiver is provided with a transmitting function, and the local oscillator functions as a modulator when the receiver transmits a signal.

4. The semiconductor device according to claim 1, further comprising:
   a signal generator for generating a modulation signal having a frequency corresponding to the error signal; and
   a quadrature modulator connected to the signal generator and the local oscillator to modulate the local signal with the modulation signal.

5. The semiconductor device according to claim 4, wherein the receiver is provided with a transmitting function, and the quadrature modulator functions as a modulator when the receiver transmits a signal.

6. A semiconductor device for a receiver having a reference oscillator and a band pass filter, wherein the receiver uses a reference signal generated by the reference oscillator to receive a signal in a predetermined channel bandwidth, the semiconductor device comprising:
   a local oscillator for generating a local signal;
   a first control loop including the local oscillator for controlling a frequency of the local signal based on the reference signal to set the channel bandwidth;

a second control loop including the local oscillator for comparing frequency of the received signal with frequency of the reference signal or phase of the received signal with phase of the reference signal and generating an error signal in accordance with the comparison to correct the local frequency; and a frequency controller connected to the band pass filter to set a center frequency of the band pass filter using the reference signal.

7. The semiconductor device according to claim 6, further comprising:

a loop switching circuit connected to the local oscillator to selectively validate the first control loop and the second control loop, wherein the loop switching circuit invalidates the first control loop and validates the second control loop after setting the channel bandwidth with the first control loop.

8. A semiconductor device for a receiver having a reference oscillator and a band pass filter, wherein the receiver uses a reference signal generated by the reference oscillator to receive a signal of a predetermined channel, the semiconductor device comprising:

a local oscillator for generating a local signal;

a mixer connected to the local oscillator for generating an intermediate frequency signal having a predetermined intermediate frequency with the local signal and the received signal;

a PLL controller connected to the local oscillator for setting a frequency of the local signal with the reference signal to receive the received signal of the predetermined channel;

a comparator connected to the local oscillator for comparing a frequency of the intermediate frequency signal with frequency of the reference signal or phase of the intermediate frequency signal with phase of the reference signal and generating an error signal in accordance with the comparison to correct the frequency of the local signal; and a frequency controller connected to the band pass filter to set a center frequency of the band pass filter using the reference signal.

9. The semiconductor device according to claim 8, wherein the band pass filter has a predetermined passage bandwidth through which the intermediate frequency signal passes; the semiconductor device further comprising:

a demodulator connected to the band pass filter for demodulating the intermediate frequency signal to generate a carrier signal, wherein the comparator compares frequency of the carrier signal with frequency of the reference signal or phase of the carrier signal with phase of the reference signal and generates the error signal in accordance with the comparison to correct the frequency of the local signal.

10. The semiconductor device according to claim 9, further comprising:

a divider connected to the reference oscillator for dividing the reference signal to generate a divisional reference signal, wherein the comparator compares frequency of the carrier signal with frequency of the divisional reference signal or phase of the carrier signal with phase of the divisional reference signal and generates the error signal in accordance with the comparison to correct the frequency of the local signal.

11. The semiconductor device according to claim 9, further comprising:

a frequency controller connected to the band pass filter and the reference oscillator to set a center frequency of the band pass filter to the intermediate frequency with the reference signal.

12. The semiconductor device according to claim 8, further comprising:

a switching circuit connected to the local oscillator to selectively connected the PLL control circuit and the comparator to the local oscillator.

13. The semiconductor device according to claim 8, wherein the receiver is provided with a transmitting function, and the local oscillator functions as a modulator when the receiver transmits a signal.

14. A receiver for receiving a signal, the receiver comprising:

a reference oscillator for generating a reference frequency signal having a reference frequency;

a local oscillator for generating a local signal;

a band pass filter having a predetermined passage bandwidth;

a channel setting circuit connected to the reference oscillator and the local oscillator for controlling frequency of the local signal in accordance with the reference frequency signal and setting the passage bandwidth of the band pass filter to a predetermined channel bandwidth;

a frequency correction circuit for comparing frequency of the received signal received in the channel bandwidth with frequency of the reference signal or phase of the received signal with phase of the reference signal and generating an error signal in accordance with the comparison to correct the frequency of the local signal; and a frequency controller connected to the band pass filter to set a center frequency of the band pass filter using the reference signal.

15. A method for correcting frequency of a local signal in a receiver, wherein the receiver includes a reference oscillator for generating a reference signal having a reference frequency, and a band pass filter, the method comprising:

setting a center frequency of the band pass filter with the reference signal;

generating a local signal for receiving a received signal of a predetermined channel with the reference signal;

generating an intermediate frequency signal having a predetermined intermediate frequency with the received signal and the local signal;

providing the intermediate frequency signal to the band pass filter;

generating an error signal in accordance with a comparison between frequency of the intermediate frequency signal that passed through the band pass filter and frequency of the reference signal or a comparison between phase of the intermediate frequency signal with phase of the reference signal; and correcting the frequency of the local signal in accordance with the error signal.

16. The method according to claim 15, wherein said setting a center frequency includes setting the center frequency to the predetermined intermediate frequency.

17. The method according to claim 16, further comprising:

generating a carrier signal by demodulating the intermediate frequency signal, wherein said generating an error signal includes comparing frequency of the carrier signal with frequency of the reference signal or phase of the carrier signal with phase of the reference signal to generate the error signal in accordance with the comparison.

18. The method according to claim 17, further comprising:
generating a divisional reference signal by dividing the reference signal, wherein said generating an error signal includes comparing frequency of the carrier signal with frequency of the divisional reference signal or phase of the carrier signal with phase of the divisional reference signal to generate the error signal in accordance with the comparison.

* * * * *